United States Patent [19]

Nomura et al.

[11] 3,753,803

[45] Aug. 21, 1973

[54] METHOD OF DIVIDING SEMICONDUCTOR LAYER INTO A PLURALITY OF ISOLATED REGIONS

[75] Inventors: Masayoshi Nomura, Kokubunji-shi; Hiroji Saida, Hachioji-shi; Yoshio Shimura; Hisumi Sano, both of Tokyo; Yuichi Ono, Kokubunji-shi, all of Japan

[73] Assignee: Hitachi, Ltd., Tokyo, Japan

[22] Filed: Dec. 4, 1969

[21] Appl. No.: 881,963

[30] Foreign Application Priority Data

Dec. 6, 1968 Japan ............................... 43/88978

Aug. 25, 1969 Japan ............................... 44/66511

[52] U.S. Cl. .................... 148/175, 29/578, 29/580, 148/187, 156/17, 317/235 R

[51] Int. Cl. ............................ H01l 7/36, H01l 7/50

[58] Field of Search .................... 148/1.5, 174, 175, 148/187; 317/234, 235; 117/200, 201, 212; 156/17; 252/79.2; 29/580

[56] References Cited

UNITED STATES PATENTS

| | | | |
|---|---|---|---|
| 3,566,220 | 2/1971 | Post | 317/235 |
| 3,243,323 | 3/1966 | Corrigan et al. | 148/175 |
| 3,370,995 | 2/1968 | Lowery et al. | 148/175 |
| 3,210,620 | 10/1965 | Lin | 317/234 |
| 3,500,139 | 3/1970 | Frovin et al. | 317/235 |
| 3,456,169 | 7/1969 | Klein | 317/235 |
| 3,210,677 | 10/1965 | Lin et al. | 317/235 X |
| 3,394,037 | 7/1968 | Robinson | 148/187 |
| 3,419,956 | 1/1969 | Kren et al. | 29/580 |
| 3,425,879 | 2/1969 | Shaw et al. | 148/175 |
| 3,426,254 | 2/1969 | Bouchard | 317/235 |
| 3,566,220 | 2/1971 | Post | 317/235 |

OTHER PUBLICATIONS

Jackson, D. M., "Advanced Epitaxial Processes–Circuit Applications", Trans. Metall. Soc. Aime, Vol. 233, Mar., 1965, pp. 596–602.

Czorny, B., "Epitaxy–Versatile Technology–Circuits", R.C.A. Engineer, Vol. 13, No. 3, Oct–Nov. 1967, pp. 28–32.

*Primary Examiner*—L. Dewayne Rutledge
*Assistant Examiner*—W. G. Saba
*Attorney*—Craig, Antonelli & Hill

[57] ABSTRACT

A method of isolation, comprising forming a semiconductor epitaxial layer on one surface of a semiconductor substrate, said epitaxial layer having a conductivity tape opposite to that of said semiconductor substrate, forming at least one groove in said epitaxial layer so that the groove extends to the surface of said semiconductor substrate to divide said epitaxial layer into a plurality of regions, and employing an epitaxial growth process to fill the groove with a semiconductor layer of the same conductivity type as the substrate thereby to divide said epitaxial layer into a plurality of electrically isolated regions.

6 Claims, 26 Drawing Figures

INVENTORS

MASAYOSHI NOMURA, HIROJI SAIDA,
YOSHIO SHIMURA, HISUMI SANO and
YUICHI ONO

BY

Craig, Antonelli, Stewart & Hill

ATTORNEYS

INVENTORS

MASAYOSHI NOMURA, HIROJI SAIDA, YOSHIO SHIMURA, HISUMI SANO and YUICHI ONO

BY Craig, Antonelli, Stewart & Hill

ATTORNEYS

INVENTORS

MASAYOSHI NOMURA, HIROJI SAIDA, YOSHIO SHIMURA, HISUMI SANO and YUICHI ONO

BY Craig, Antonelli, Stewart & Hill

ATTORNEYS

METHOD OF DIVIDING SEMICONDUCTOR LAYER INTO A PLURALITY OF ISOLATED REGIONS

BACKGROUND OF THE INVENTION

1. Field of the Invention

This invention relates to an improved method for the isolation of circuit elements in a semiconductor integrated circuit from each other.

2. Description of the Prior Art

Several methods have heretofore been proposed and put into practice for the isolation of circuit elements in a semiconductor integrated circuit from each other. According to one of these methods, a pn junction is formed between adjacent circuit elements so as to utilize the backward resistance of the pn junction to isolate the circuit elements from each other, while according to another method, an insulator layer such as a silicon dioxide film is disposed between adjacent circuit elements to isolate the circuit elements from each other or a groove is formed between the circuit elements to isolate the circuit elements from each other by means of an air gap.

The former method is defective in that it requires an extended period of time, of the order of 10 to 15 hours to obtain the pn junction as this method relies upon the solid diffusion of an isolating impurity, and also due to the fact that a high temperature of the order of 1,100° to 1,300°C. is required for the diffusion of the isolating impurity, the impurity distribution already established in the semiconductor substrate is varied by the rediffusion during the solid diffusion of the isolating impurity resulting in an undesirable variation in the electrical characteristics of the circuit elements. This method is also defective in that the impurity concentration at the surface portion of the substrate is high because the pn junction is formed within the solid by diffusion, and it is thus inevitable that the isolating pn junction at the substrate surface portion has a low backward breakdown voltage and a relatively high leakage current.

The latter method, that is, the method of isolation by an insulator is defective in that it involves complex and difficult manufacturing steps and heat cannot be satisfactorily dissipated from the circuit elements because the circuit elements are entirely covered with the insulating layer.

SUMMARY OF THE INVENTION

It is an object of the present invention to provide an improved method of isolating the circuit elements in a monolithic semiconductor integrated circuit from each other.

Another object of the present invention is to provide a novel method of isolation which can be carried out within a short period of time and at a low temperature compared with the prior art methods of isolation.

A further object of the present invention is to provide a novel method of isolation in which an isolating layer can be formed simultaneously with one of the processes for forming the circuit elements.

In order to attain the various objects of the present invention described above, the present invention contemplates the provision of a method of isolation comprising the steps of forming a semiconductor epitaxial layer on a semiconductor substrate, said epitaxial layer having a conductivity type opposite to that of said semiconductor substrate, forming at least one groove in said epitaxial layer so that it extends from the surface of said epitaxial layer to the substrate through said epitaxial layer thereby to divide said epitaxial layer into a plurality of regions, and causes the epitaxial growth of a semiconductor in said groove while introducing an impurity of a conductivity type opposite to that of said epitaxial layer into said groove thereby to obtain an epitaxially grown semiconductor layer of the same conductivity type as that of said substrate, or after dividing said epitaxial layer into a plurality of regions by the grooves, diffusing an impurity of the conductivity type opposite to that of said epitaxial layer into the surface of said groove thereby to form a diffused layer of the opposite conductivity type therein and causing epitaxial growth of a semiconductor in said groove while introducing an impurity of a conductivity type opposite to that of said epitaxial layer into said groove thereby to obtain a plurality of epitaxial regions isolated from each other by a pn junction.

A monolithic integrated circuit can be obtained by selectively diffusing impurities into the epitaxial regions isolated from each other by the above method so as to suitably form at least one circuit element such as a transistor, diode and resistor and suitably connecting the circuit element or elements in these regions with each other by an evaporated wiring layer deposited on a thin insulator layer covering the epitaxial layer.

The above and other objects, features and advantages of the present invention will become apparent from the following detailed description of some preferred embodiments of the present invention taken in conjunction with the accompanying drawings.

DESCRIPTION OF THE PREFERRED EMBODIMENTS

EXAMPLE 1

Figure 1:
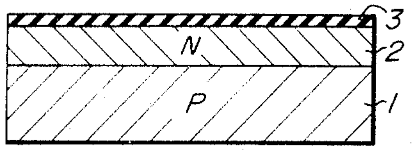
FIGS. 1 through 4 are schematic vertical sectional views showing successive steps in an embodiment of the present invention to illustrate how transistor elements are isolated from each other.
Figure 2:
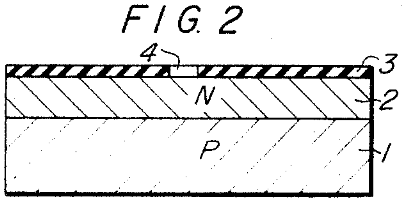
Figure 3:
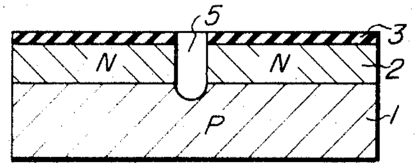

Referring to FIG. 1, an epitaxial layer 2 of N-type silicon is formed on one principal surface of a substrate 1 of a P-type silicon substrate by heating it in a gas mixture of silicon tetrachloride, hydrogen and N-type impurity gas, and a silicon dioxide film 3 is then deposited on the epitaxial layer 2. In forming the epitaxial layer 2, the concentration of the impurity in the reacting gas may be varied so that an $N^+$-type layer having a high impurity concentration may be formed at first and then an N-type layer having a less impurity concentration may be formed on the $N^+$-type layer or an $N^+$-type layer having a desired area may be preliminarily formed on the surface of the silicon substrate 1 by diffusion. A window or opening 4 is then formed in the silicon dioxide film 3 by utilizing a known photoetching technique as shown in FIG. 2. The portion of the silicon epitaxial layer 2 exposed from the window 4 in the silicon dioxide film 3 is then removed by a chemical etching solution or by a vapor etching method to form a groove 5 as shown in FIG. 3. The chemical etching solution may be a mixture of 100 cc of nitric acid, 10 cc of hydrofluoric acid and 10 cc of acetic acid, while in the case of vapor etching, the specimen may be heated to about 1,100°C. in a gaseous phase of hydrogen chloride. The groove 5 must extend to the substrate 1 of the P-type silicon substrate. Thus, the groove 5 divides the epitaxial layer 2 into a plurality of parts or regions.

Figure 4:
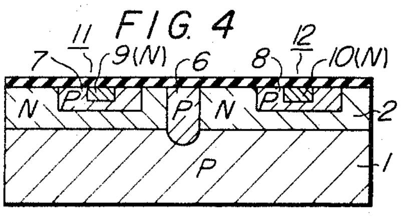

The semiconductor substrate of the structure shown in FIG. 3 is placed in an epitaxial growth reaction furnace (not shown) and a gaseous mixture consisting of silicon tetrachloride, hydrogen and boron hydride or boron chloride is admitted into the furnace. When the semiconductor substrate is heated to a temperature of 1,100° to 1,300°C. in the presence of the gaseous mixture, the silicon tetrachloride is reduced by the hydrogen and silicon grows epitaxially in the groove 5 as at 6 (FIG. 4). The epitaxially grown layer 6 of silicon has a P-type conductivity since the gaseous atmosphere in the reaction furnace contains boron hydride or boron chloride. Thus, the P-type epitaxial layer 6 is connected with the substrate 1 and forms a PN junction between it and the N-type epitaxial layer 2 to divide the N-type epitaxial layer 2 into a plurality of isolated regions. After the above steps, a conventional selective diffusion method is utilized to form the diffused P-type layers 7 and 8 and diffused N-type layers 9 and 10 into the N-type epitaxial layer 2 to obtain circuit elements or npn transistors 11 and 12 as shown in FIG. 4.

The circuit elements 11 and 12 are electrically isolated from each other by the epitaxially grown layer 6 of silicon. The resistivity of the epitaxially grown layer 6 can be controlled to any desired high or low value by varying the amount of boron hydride ($B_2H_6$) in the reacting gaseous mixture and the distribution of the impurity concentration in the epitaxial layer 6 can be uniformly or continuously varied. Therefore, the epitaxial layer 6 has an excellent insulating property over the prior art isolating layer that are formed by the diffusion of an impurity.

In the present embodiment, the lower limit of the preferred temperature range for forming the epitaxial layer 6 is about 1,000°C, since at lower temperatures the epitaxially grown layer 6 will have a polycrystalline structure, while the upper limit of the temperature range is the melting point of the substrate, which is 1,460°C.

EXAMPLE 2

Figure 5:
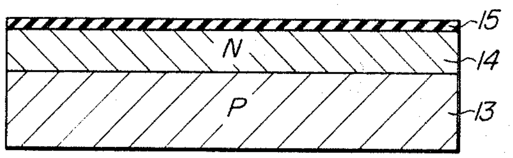
FIGS. 5 through 8 are schematic vertical sectional views showing successive steps in another embodiment of the present invention to illustrate how an isolating layer and a filled epitaxial layer can simultaneously be formed.
Figure 6:
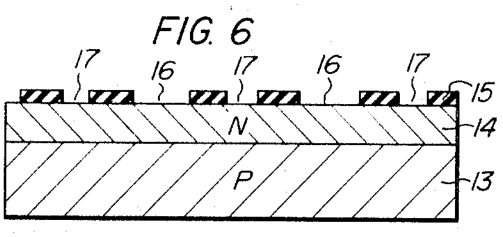

Referring to FIG. 5, an epitaxial layer 14 of N-type silicon about 8 $\mu$ thick is formed on the {100} plane of a substrate 13 of P-type silicon. As in the preceding example, the epitaxial layer 14 of N-type silicon may be formed by first forming an $N^+$-type layer and then superposing an N-type layer on the $N^+$-type layer. A silicon nitride ($Si_3N_4$) film 15 is then deposited on the epitaxial layer 14. Subsequently, a known photoetching technique is utilized to form windows or openings 16 and 17 in the epitaxial layer 14 as shown in FIG. 6. The windows 16 have a relatively larger width and have, for example, an area about 300 $\mu \times$ 300 $\mu$ and the windows 17 are narrow having a relatively smaller width, for example, a width of about 20 $\mu$. The narrow windows 16 substantially surround their associated windows 16. The semiconductor substrate 13 of the structure shown in FIG. 6 is placed on the specimen supporting bed in an epitaxial growth reaction furnace (not shown) and a gaseous mixture of hydrogen chloride and hydrogen (at a mixture ratio of $HCl/H_2$ 2 %) is introduced into the furnace while heating the substrate at 1,150°C. to subject the portions of the epitaxial layer 14 not covered by the silicon nitride film 15 to vapor etching. The depth of the groove and recess formed by the vapor etching varies depending on the width of the window formed in the silicon nitride film 15. More precisely, the smaller the width of the window the deeper is the groove, formed by vapor etching, while conversely, with a wider window—the groove is shallower.

The following table gives the results of a test to find the relation between the rate of etching and the window width when the epitaxial layer is etched by a gaseous mixture of hydrogen chloride and hydrogen while heating the substrate at 1,150°C.

| hole width | $HCl/H_2$ 2 % | 4 % | 6 % | 8 % |
|---|---|---|---|---|
| | Etching rate ($\mu$/min) | | | |
| 20 $\mu$ | 2.0 | 4.0 | 5.8 | 7.3 |
| 50 $\mu$ | 1.6 | 3.2 | 5.3 | 7.5 |
| 100 $\mu$ | 1.5 | 3.0 | 5.0 | 7.0 |
| 200 $\mu$ | 1.0 | 2.8 | 4.5 | 6.4 |
| 500 $\mu$ | 0.8 | 2.5 | 4.2 | 6.0 |

Figure 7:
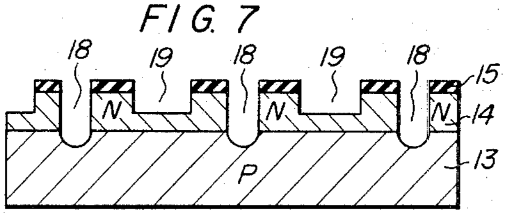

On the basis of the above test results, the duration of vapor etching should be adjusted so that the groove formed beneath the hole 17 in the silicon nitride film 15 is at least deeper than the depth of the epitaxial layer 14 to expose the corresponding portion of the substrate crystal and the recess formed beneath the hole 16 in the silicon nitride film 15 is shallower than the depth of the epitaxial layer 14. FIG. 7 shows schematically the state of the specimen after it has been subjected to vapor etching for about 5 minutes. In FIG. 7, the deeply etched grooves 18 are about 10 $\mu$ deep, while the relatively shallowly etched recess 19 is about 5 $\mu$ deep.

Figure 8:
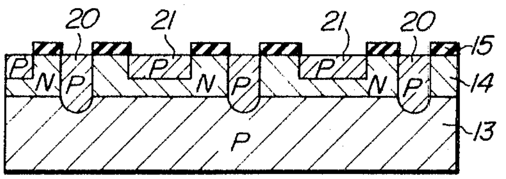

The gaseous mixture existing within the reaction furnace is then replaced by one consisting of silicon tetrachloride, hydrogen, hydrogen chloride and boron hydride or boron chloride without varying the ambient temperature of 1,150°C. By the action of this gaseous mixture, epitaxial layers 20 and 21 of P-type silicon grow in the each groove 18 and recesses 19 formed by the vapor etching as shown in FIG. 8. The rate of epitaxial growth in the deep groove 18 is faster than that in the shallow recess 19, and the epitaxial layer 20 in the deep groove 18 has grown to substantially extend to the surface of the epitaxial layer 14 when the epitaxial layer 21 in the shallow recess 19 grows to extend to the surface of the epitaxial layer 14. FIG. 8 shows schematically that these epitaxial layers 20 and 21 have grown to extend to the substantially same level.

In a case where the rate of epitaxial growth of the silicon layers is quite fast, polycrystalline silicon may be precipitated on the silicon nitride film 15. The addition of hydrogen chloride in the reacting gaseous mixture is intended to avoid the undesirable precipitation of polycrystalline silicon.

A silicon dioxide film or the like may then be deposited on the embedded epitaxial layers 21, and a known photoetching technique may be utilized to form a window of a predetermined shape in the silicon dioxide film portion covering each epitaxial layer 21 so as to diffuse any desired impurity into the epitaxial layers 21 through the windows.

The present embodiment is advantageous in the high production rate in that the embedded epitaxial layer and the isolating layer can be formed simultaneously without exposing the substrate to the external atmosphere.

The present embodiment is further advantageous in that the base region can be formed simultaneously with the formation of the isolating region, thereby reducing the number of steps for the manufacture of integrated circuits.

EXAMPLE 3

It is common practice to embed a high-doped region in the collector region of an epitaxial transistor or the like in order to reduce the resistance of the collector region. This high-doped region is commonly called a buried layer or embedded layer and is preformed in the surface of a semiconductor substrate before forming an epitaxial layer. However, in this case, since the embedded layer is solely disposed beneath the epitaxial layer and the collector electrodes are directly connected to the epitaxial layer having a relatively high resistivity, the collector resistance can not be reduced so much as is desired.

Another embodiment of the present invention provides a method of making a circuit element such as a transistor in an integrated circuit in which an embedded layer extends to the electrode region of the transistor thereby giving a very low collector resistance. The successive steps of the method will be described with reference to FIGS. 9 through 17.

Figures 9, 10, 11, 12, 13, 14, 15, 16, 17:
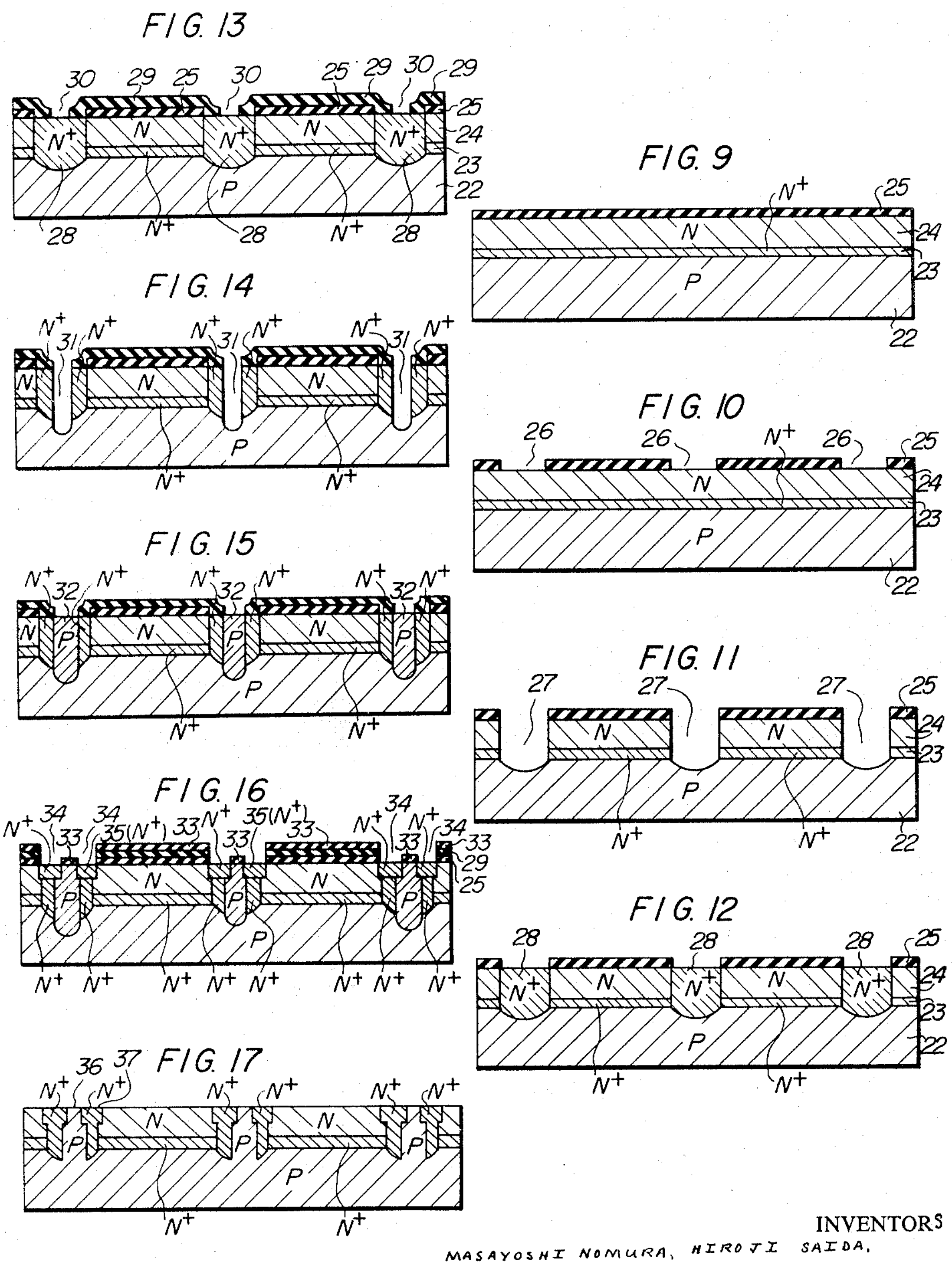
FIGS. 9 through 17 are schematic vertical sectional views showing successive steps in a further embodiment of the present invention to illustrate how circuit elements having a high-doped filled layer can be formed simultaneously with the formation of an isolating layer, isolating these circuit elements from each other.

Referring to FIG. 9, an embedded layer 23 of $N^+$-type silicon is formed on one principal surface of a substrate 22 of P-type silicon by means of impurity diffusion or epitaxial growth. An epitaxial layer 24 of N-type silicon having a relatively high resistivity is then formed on the embedded layer 23. After the epitaxial layer 24 has been deposited to a predetermined thickness, an insulator layer 25 of silicon dioxide, silicon nitride or the like is deposited on the epitaxial layer 24 by means of a known film deposition method. A known photoetching technique is then utilized to form windows 26 in the predetermined portions of the insulator layer 25 as shown in FIG. 10. Those portions of the epitaxial layer 24 exposed from the windows 26 are subjected to vapor etching in an atmosphere of a gaseous mixture of hydrogen chloride and hydrogen so as to form groove 27 dividing the epitaxial layer 24 into a plurality of regions as shown in FIG. 11. The groove 27 must be sufficiently deep so that they extend to the embedded layer 23.

A known method is then utilized to form high-doped embedded epitaxial layers 28 of N-type silicon in the groove 27 as shown in FIG. 12. After the epitaxial layers 28 have substantially grown to the level of the surface of the epitaxial layer 24, a second insulator film 29 which may be a silicon dioxide film is deposited over the entire surface of the first insulator layer 25 by the thermal decomposition of organoxysilane, and a known photoetching technique is utilized to form a window 30 in the insulator film portion covering each of the embedded epitaxial layers 28 as shown in FIG. 13. Those portions of the epitaxial layers 28 exposed from the holes 30 are etched away to form grooves 31 in each of the epitaxial layers 28 as shown in FIG. 14. A chemical etching method or vapor etching method may be employed as required to form the grooves 31. As seen in FIG. 14, the grooves 31 must be sufficiently deep so that they penetrate through the epitaxial layers 28 to extend to the substrate crystal thereby to expose the corresponding portions of the substrate 22. after the grooves 31 have been formed, an epitaxial layer 32 of P-type silicon is grown in each of the grooves 31 as shown in FIG. 15. It is desirable that the epitaxial layer 32 has a high resistivity substantially equivalent to that of the substrate 22.

A third insulator film 33 such as a silicon dioxide film is then deposited by any suitable method such as a thermal decomposition or evaporation method to cover all the surface of the epitaxial layers 32, and a known photoetching technique is utilized to form windows 34 through the first, second and third insulator films 25, 29 and 33 as shown in FIG. 16. The specimen is then placed in an impurity diffusion furnace (not shown) to diffuse an N-type impurity through the windows 34 thereby to form high-doped or $N^+$-type layers 35 as seen in FIG. 16. The insulator films 25, 29 and 33 are subsequently removed by a chemical etching solution to obtain a structure as shown in FIG. 17.

It will thus be seen that a high-doped embedded layer and an isolating layer extending to the surface of the epitaxial layer can be formed by the above steps. The N-type epitaxial layer surrounded by the embedded layers is utilized for forming a transistor or diode. This can be realized by depositing a new insulator film such as a silicon dioxide film on the surface of the specimen and selectively diffusing impurities according to a known planar technique. Accurate positioning of holes to be formed in the mask layer may be easily done by taking as a reference the difference in the relative height between the embedded epitaxial layer 32 and the original epitaxial layer 28 since the level of the surface 36 of the embedded epitaxial layer 32 is slightly offset from the level of the surface 37 of the original epitaxial layer 28 as seen in FIG. 17.

EXAMPLE 4

In example 3, a pn junction is formed between an epitaxial layer and a so-called embedded epitaxial layer which is embedded after etching a predetermined portion of the epitaxial layer, and the pn junction is utilized to isolate circuit elements in an integrated circuit from each other. However, the electrical characteristics of the junction have not necessarily been satisfactory for the following reasons. That is, the surface of the epitaxial layer having therein the embedded epitaxial layer is not necessarily completely flat and the end edge portion of the embedded layer tends to be more or less uneven, with the result that dirt and foreign matter tends to accumulate in the concave portion while lattice defects tends to develop in the convex portion. This leads to the disadvantage that the electrical characteristics of the pn junction formed at that portion are quite unsatisfactory.

The present embodiment is intended to overcome the above disadvantage and provides a method of dividing a semiconductor epitaxial layer of a second conductivity type grown on a semiconductor substrate of a first conductivity type into a plurality of electrically isolated regions comprising forming a groove or recess of a predetermined shape at the boundary between the isolated regions of the epitaxial layer, said groove extending from the surface of said epitaxial layer to the surface of said semiconductor substrate, diffusing an impurity of the first conductivity type opposite to that of said epitaxial layer into the surface portions of said recess so as to provide a diffused region of the first conductivity type, and then filling up the groove in said epitaxial layer with a semiconductor of the first conductivity type.

Figure 18:
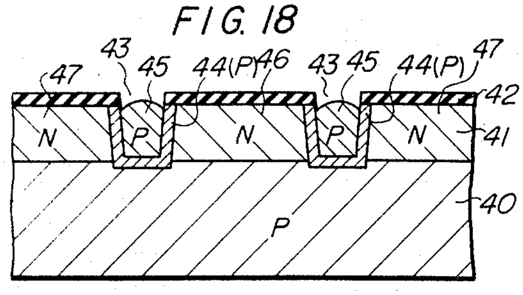
FIG. 18 is a schematic vertical sectional view of a semiconductor substrate to illustrate another embodiment of the present invention.

Referring to FIG. 18, a crystalline substrate 40 of P-type silicon having a resistivity of 10 ohm-cm and ground to a mirror finish at its {100} plane is first prepared, and an epitaxial layer 41 of N-type silicon about 4 $\mu$ thick having a resistivity of 0.2 ohm-cm is grown on the substrate 40 by reducing a silicon halide by hydrogen in the presence of an impurity gas. Subsequently, the CVD method, which is well-known in the art, is utilized to deposit a silicon dioxide film 42 about 0.8 $\mu$ thick on the epitaxial layer 41 by the thermal decomposition of, for example, tetraethoxysilane. After selectively etching the silicon dioxide film 42 to remove predetermined portions 43 thereof, the specimen is placed in an epitaxial growth reaction furnace (not shown) to remove those portions of the epitaxial layer 41 of silicon underlying the portions 43 by a known method, for example, by vapor etching with a gaseous mixture of hydrogen chloride and hydrogen thereby to form grooves in the epitaxial silicon layer 41. A P-type impurity is diffused into the surface portions of the grooves to form a thin P-type diffused region 44 in each of the grooves. Subsequently, a crystalline layer 45 of P-type silicon is epitaxially grown in each grooves by an epitaxial growth process in the epitaxial growth furnace until the silicon layers 45 extends substantially to the surface of the epitaxial silicon layer 41.

The isolation is completed by the above steps. The embedded layers 45 constitute a closed loop, and thus the portion 46 of the epitaxial layer 41 surrounded by the embedded layers 45 is electrically isolated from the remaining portions 47 of the epitaxial layer 41 by a pn junction. The silicon layer 45 grown in the above manner may not be single-crystalline because a diffused junction is used for the isolation. Thus, the silicon layer 45 may be grown at a relatively low temperature of, for example, 500° to 600°C. so that it may have a polycrystalline structure.

EXAMPLE 5

The successive steps for the manufacture of an npn transistor in an epitaxial layer according to the present invention will be described with reference to FIGS. 19 through 24.

Figure 19:
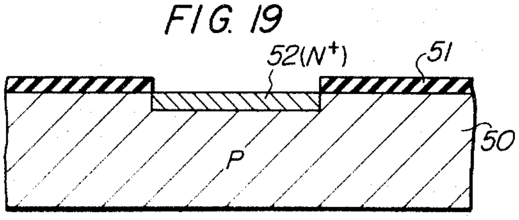
FIGS. 19 through 24 are schematic vertical sectional views showing successive steps for the manufacture of a transistor in an integrated circuit in accordance with a further embodiment of the present invention.
Figure 20:
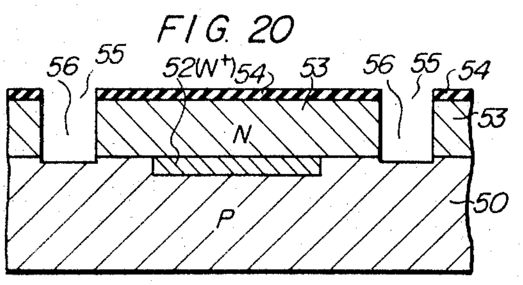
Figure 21:
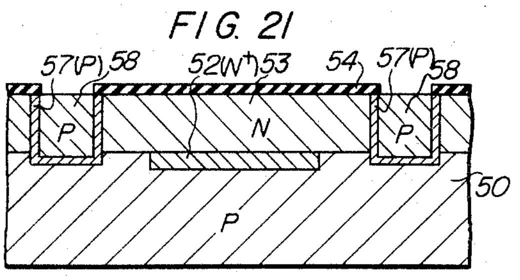

Referring to FIG. 19, a single-crystalline substrate 50 of P-type silicon having a resistivity of 10 ohm-cm and ground to a mirror finish at its {100} plane is first prepared, and a silicon dioxide film 51 about 7,000 A thick is deposited on the surface of the substrate 50 by a thermal oxidation method. A predetermined portion of the silicon dioxide film 51 is chemically etched by a known selective etching technique and then antimony is diffused into the substrate 50 at 1,200°C. according to a known diffusion method to form a high-doped $N^+$-type region or buried layer 52 as shown in FIG. 19. Subsequently, the silicon dioxide film 51 is completely removed and an epitaxial layer 53 of N-type silicon about 4 $\mu$ thick having a resistivity of 0.2 ohm-cm is grown on the substrate 50 by reducing silicon tetrachloride with hydrogen. The CVD method well-known in the art is then utilized to deposit a silicon dioxide film 54 about 8,000 A thick on the epitaxial layer 53 as shown in FIG. 20. Predetermined portions 55 of the silicon dioxide film 54 are removed by a selective etching technique and then the portions 56 of the epitaxial silicon layer 53 underlying the portions 55 are removed by vapor etching in an epitaxial growth reaction furnace (not shown) as shown in FIG. 20. The removal of silicon is carried out by heating the substrate at 1,150°C in a hydrogen atmosphere and then admitting a gaseous mixture of hydrogen chloride and hydrogen ($HCl/H_2$ 8 %) into the furnace to remove silicon by a depth which is substantially equal to the thickness of the epitaxial layer 53. A known diffusion method is then utilized to diffuse boron into the surface portions of the grooves for about 15 minutes at 1,000°C to form P-type diffused regions 57 as shown in FIG. 21. Subsequently, a crystalline layer 58 of P-type silicon is epitaxially grown in each of the grooves by an epitaxial growth process in the epitaxial growth reaction furnace until the silicon layers 58 extend substantially to the surface of the epitaxial silicon layer 53 as shown in FIG. 21. The isolation is completed by the above steps.

Figure 22:
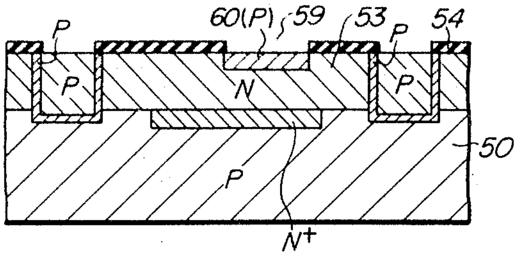
Figure 23:
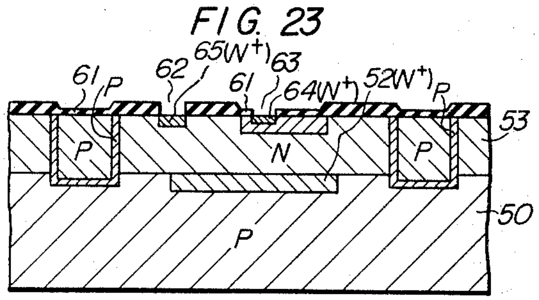

A portion 59 of the silicon dioxide film 54 covering a region corresponding to the base of a transistor is removed by a selective etching technique and boron is diffused according to a known diffusion method to form a base region 60 in the epitaxial layer 53 as shown in FIG. 22. A thin silicon dioxide film 61 is deposited in the above step to cover the opening 59 in the silicon dioxide film 54 since boron is diffused in an oxidizing atmosphere. Then, according to common practice, predetermined portions 62 and 63 of the silicon dioxide covering are selectively etched and phosphorus is diffused at 1,050°C to obtain an emitter region 64 and a low-resistance contact region 65 for the collector as shown in FIG. 23. An npn transistor structure electrically isolated from the remaining portions of the epitaxial layer can be obtained by the above steps.

Figure 24:
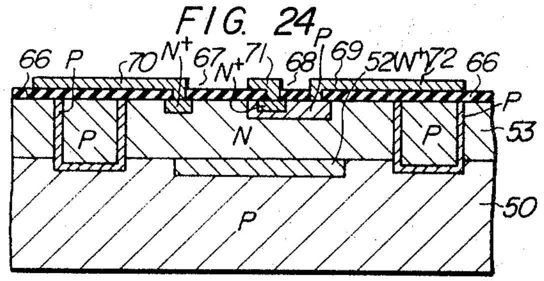

After completely removing the silicon dioxide covering used as an impurity diffusion mask, a fresh silicon dioxide film 66 is deposited by the CVD method well known in the art. Windows 67, 68 and 69 for transistor electrodes are then formed in the silicon dioxide film 66 and a film of electrode metal such as aluminum about 7,000 A thick is deposited over the entire surface of the silicon dioxide film 66 by evaporation. The evaporated aluminum film 66 is etched according to a predetermined pattern to provide electrodes 70, 71 and 72 for the npn transistor as shown in FIG. 24.

EXAMPLE 6

Figure 25:
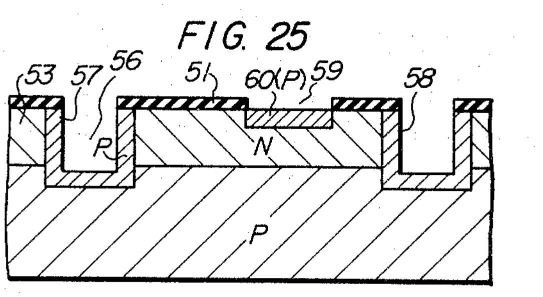
FIG. 25 is a schematic vertical sectional view showing a step for the manufacture of a transistor in an integrated circuit in accordance with another embodiment of the present invention.

FIG. 25 shows a modification of example 5. According to this example, the diffused base layer of the transistor can be formed during the step of diffusing the P-type impurity into the surface portions of the grooves formed in the epitaxial layer. Referring to FIG. 25, boron is diffused into the surface portions of grooves 56 provided in an epitaxial layer 53 to form a diffused isolating layer 57 in each groove 56, and at the same time the boron is diffused into the epitaxial layer 53 through an opening 59 to form a diffused base layer 60. This method is advantageous over the method described in example 5 in that one of the steps of high temperature heat treatment can be eliminated.

EXAMPLE 7

Figure 26:
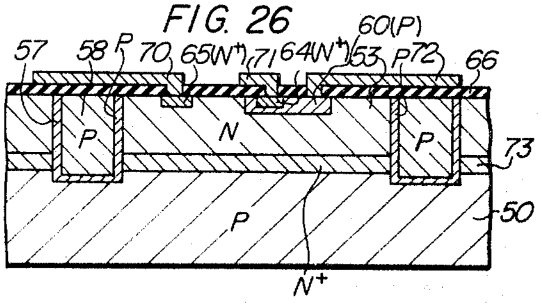
FIG. 26 is a schematic vertical sectional view of a transistor in an integrated circuit made in accordance with yet another embodiment of the present invention.

This example relates to a process in which a buried layer is formed by means of epitaxial growth. In FIG. 26, like reference numerals are used to denote like parts appearing in FIGS. 19 through 24 illustrating example 5.

Referring to FIG. 26, a high-doped epitaxial layer 73 of $N^+$-type silicon is grown on one surface of a substrate 50 of P-type silicon, and then an epitaxial layer 53 of N-type silicon is grown on the epitaxial layer 73. Grooves or recesses extending through the epitaxial layers 53 and 73 to the surface of the substrate 50 are then provided in the epitaxial layers 53 and 73 so as to form embedded isolating layers, and subsequently a P-type impurity is diffused at a high temperature into the surface portions of the grooves to form a P-type diffused layer 57 in each of the grooves. An embedded layer 58 of P-type silicon is then epitaxially grown in each of the grooves. Subsequently, impurities are selectively diffused to form a P-type diffused base layer 60, an N-type diffused emitter layer 64, and an N-type diffused layer 65 for the collector electrode thereby to obtain a transistor structure. Windows are then formed in those portions of a silicon dioxide film 66 overlying the electrode regions of the transistor. Aluminum is evaporated and the evaporated aluminum film is subjected to photoetching to obtain aluminum electrodes 70, 71 and 72.

It will be understood that a transistor in an integrated circuit can be obtained by utilization of the epitaxial growth layers of an $N^+$-type layer and a super-posed N-type layer. The buried layer in this embodiment is formed by epitaxial growth and therefore the time required for the formation thereof is quite short compared with example 5 in which the valid layer is formed by diffusion.

The present invention has many advantages as described below as will become apparent from the foregoing description of various embodiments thereof.

According to the present invention, an isolating layer can be formed in a short period of time and is excellent in its isolation performance such as backward breakdown voltage (dielectric strength) and leakage current compared with prior art isolations carried out by diffusion techniques. According to the present invention, further, circuit elements having uniform electrical properties can be obtained, since an isolation and an embedded epitaxial layer can be simultaneously formed in the same reaction furnace without exposing the substrate to the external atmosphere. A transistor element formed in the epitaxial layer shows a satisfactory high-frequency response because the capacity of the isolation is small and the series resistance of the transistor is also small.

When the isolating pn junction is formed in the surface of a groove by the impurity diffusion according to one form of the present invention, the end portion of the pn junction terminating at the surface of the epitaxial layer does not contact the peripheral edge of the embedded layer but is exposed at the surface of the epitaxial layer. This removes the defect of the instability in the electrical properties of the isolation due to dirt or foreign matter that may accumulate on the end edge portion or due to lattice defects. The embedded layer in this case is not necessarily of a single-crystalline structure, and the same effect can be obtained with a polycrystalline structure. Therefore, the embedded layer may be formed at low temperatures. According to the present invention, the isolation can be attained in a short period of time, i.e., of the order of several minutes to less than twenty minutes. Thus, an undesirable re-distribution of impurities is quite negligible. The epitaxial layer may have quite a small thickness because there is very little probability that the impurity in the buried layer is re-diffused into the epitaxial layer during the step of forming the isolating layer. Due to the fact that the diffusion for forming the isolation can be carried out in a short period of time, predetermined circuit elements such as a transistor, diode and resistor may be first formed in the epitaxial layer and then the isolation according to the present invention may be provided. The number of steps of diffusion in the method according to the present invention is less than that of prior art methods because the isolating layer and the base or emitter layer can be simultaneously formed by diffusion. It will be understood from the above description that the present invention provides a very useful method for the industrial production of integrated circuits by virtue of the fact that the isolation can be carried out in a short period of time at low temperatures.

Although an insulator film in the form of a silicon dioxide film has been referred to in the embodiments of the present invention, a silicon nitride film may be employed in lieu of the silicon dioxide film. A silicon nitride film has an advantage over the silicon dioxide film in that trouble such as corrosion of the film by hydrogen existing in the reacting gaseous atmosphere and an undesirable increase in the pin holes in the film during the steps of vapor etching and epitaxial growth can be reduced to a minimum. In some cases, an aluminum oxide film may be employed in lieu of the silicon dioxide film or silicon nitride film. It has been experimentally proved that, for more effectively utilizing the aluminum oxide film, such a film may be subjected to heat treatment after the deposition of same.

The surface of the silicon substrate in the second example may preferable coincide with the {100} plane of the crystal so that the bottom of the recess 19 formed in the stage of vapor etching may have a very high degree of flatness.

The epitaxial layer and the isolating epitaxial layer may be formed by the thermal decomposition of silicon hydride ($SiH_4$) in lieu of the reduction of a semiconductor tetrachloride using hydrogen.

According to the method of the present invention, the protective film can be formed by the vapor growth and therefore the epitaxial layer and the protective film can be continuously formed in the same apparatus.

The semiconductor substrate may be any of the P-type and N-type and may be germanium or a semiconductive compound in lieu of silicon.

We claim:

1. A method of isolation comprising the steps of:

preparing a silicon semiconductor substrate having a surface of the (100) plane and being a first conductivity type, forming a semiconductor epitaxial layer of a second conductivity type opposite to said first conductivity type on the (100) plane surface of said semiconductor substrate, providing an insulator film on the surface of said semiconductor epitaxial layer of the second conductivity type, forming first and second openings in the insulator film in order to expose a predetermined surface of said semiconductor epitaxial layer, said second opening having always a width smaller than that of said first opening and surrounding each said first opening, heat treating the semiconductor substrate at a desired temperature in a gas mixture consisting of hydrogen chloride the mol percentage of which to hydrogen is from 2 to 8 thereby simultaneously forming a recess beneath said first opening so that the bottom of said recess terminates in said semiconductor epitaxial layer of the second conductivity type and a groove beneath said second opening so that said groove extends to said semiconductor substrate of the first conductivity type, and simultaneously growing an epitaxial layer of a semiconductor of the first conductivity type in each of said groove and recess so that the epitaxial layers to be grown therein simultaneously reach the surface of the semiconductor epitaxial layer on the semiconductor substrate, whereby said semiconductor epitaxial layer of the second conductivity type formed on the (100) plane surface of said semiconductor substrate of the first conductivity type is electrically divided into a plurality of isolated regions by said epitaxial semiconductor layer of the first conductivity type grown in said groove.

2. A method according to claim 1, wherein the first conductivity type is P type and the second conductivity type is N type, and wherein said first opening has a width of from 50$\mu$m to 500$\mu$m and said second opening has a width of from 20$\mu$m to 50$\mu$m.

3. A method according to claim 1, wherein the insulator film is selected from the group consisting of silicon dioxide and silicon nitride.

4. A method according to claim 1, wherein the step of growing a semiconductor layer in the groove and the recess comprises heat treating the semiconductor substrate at a desired temperature and wherein said gas mixture consists of a semiconductor halide, hydrogen and hydrogen chloride.

5. A method according to claim 1, wherein the step of forming the opening in the insulator film comprises forming a plurality of first openings therein and a second opening surrounding all the first openings in the insulator film.

6. A method according to claim 1, wherein the step of forming the openings in the insulator film comprises forming a plurality of first openings and a plurality of second openings each of the second openings surrounding a predetermined number of the first openings.

* * * * *